United States Patent
Xianyu et al.

(10) Patent No.: US 7,531,240 B2
(45) Date of Patent: May 12, 2009

(54) SUBSTRATE WITH LOCALLY INTEGRATED SINGLE CRYSTALLINE SILICON LAYER AND METHOD OF FABRICATING THE SAME

(75) Inventors: Wenxu Xianyu, Yongin-si (KR); Takashi Noguchi, Seongnam-si (KR); Young-soo Park, Suwon-si (KR); Hans S. Cho, Seoul (KR); Huaxiang Yin, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 121 days.

(21) Appl. No.: 11/311,228

(22) Filed: Dec. 20, 2005

(65) Prior Publication Data

US 2006/0144323 A1 Jul. 6, 2006

Related U.S. Application Data

(60) Provisional application No. 60/657,712, filed on Mar. 3, 2005.

(30) Foreign Application Priority Data

Dec. 30, 2004 (KR) .................... 10-2004-0117012

(51) Int. Cl.
*B32B 9/04* (2006.01)
*H01L 31/36* (2006.01)
*B32B 13/04* (2006.01)
*B32B 9/00* (2006.01)
*B32B 19/00* (2006.01)

(52) U.S. Cl. .................. 428/446; 257/51; 257/353; 257/506; 257/E21.562; 257/E21.564; 428/448; 428/688; 428/689; 428/699; 428/700

(58) Field of Classification Search ............... 257/51, 257/353, 506, E21.562, E21.564; 428/446, 428/448, 688, 689, 699, 700
See application file for complete search history.

(56) References Cited

U.S. PATENT DOCUMENTS 6,157,421 A * 12/2000 Ishii ........................ 349/43
2003/0183876 A1* 10/2003 Takafuji et al. ............. 257/347

FOREIGN PATENT DOCUMENTS

KR 2003-0077410 A 10/2003

OTHER PUBLICATIONS

Hamada et al. "Reduction of the off state current of polycrystalline thin-film transistors by means of a polysilicon buffer layer".. Electronics Letters. 1994. vol. 30, Issue 20, pp. 1719-1720.*
Korean Office Action (with English translation) dated Mar. 27, 2006.

* cited by examiner

*Primary Examiner*—Jonathan C Langman
(74) *Attorney, Agent, or Firm*—Buchanan Ingersoll & Rooney PC (57) ABSTRACT

A method of fabricating a large substrate with a locally integrated single crystalline silicon layer is provided. The method includes: forming a buffer layer on a support plate; separately fabricating a single crystalline silicon layer; attaching the single crystalline silicon layer having a predetermined thickness, which is separately fabricated, to a predetermined portion in the support plate; forming a non-single crystalline silicon layer having a predetermined thickness to cover the single crystalline silicon layer and the buffer layer; and processing the non-single crystalline silicon layer to expose a surface of the non-single crystalline silicon layer and to level the surface of the non-single crystalline silicon layer with a surface of the amorphous silicon layer.

6 Claims, 14 Drawing Sheets

SUBSTRATE WITH LOCALLY INTEGRATED SINGLE CRYSTALLINE SILICON LAYER AND METHOD OF FABRICATING THE SAME

CROSS-REFERENCE TO RELATED PATENT APPLICATIONS

This application claims the benefits of Korean Patent Application No. 10-2004-0117012, filed on Dec. 30, 2004 in the Korean Intellectual Property Office, and U.S. Patent Application No. 60/657,712, filed on Mar. 3, 2005 in the U.S. Patent and Trademark Office, the disclosures of which are incorporated herein in their entirety by reference.

BACKGROUND OF THE DISCLOSURE

1. Field of the Disclosure

The present disclosure relates to a substrate with a locally integrated single crystalline silicon layer and a method of fabricating the same.

2. Description of the Related Art

Polycrystalline silicon (poly-Si) has greater mobility than amorphous Si (a-Si), and thus can be applied to flat panel display devices and various electronic devices, such as solar batteries. However, the mobility and homogeneity of poly-Si are inferior to single crystalline Si.

Single crystalline Si is useful for a system on a glass (SOG) structure in which a system is formed on a glass display panel. The mobility of single crystalline Si is 300 $cm^2/Vs$ or greater. A high quality switching device used in a display can be manufactured using single crystalline Si having such a high mobility.

A SOG display includes a display region for displaying images and a display driver region. Although the display region and the display driver region are formed of p-Si having a mobility of about 200-300 $cm^2/Vs$, their performance is satisfactory. However, a controller, an interface, a central processing unit (CPU), and a memory, which are required for high speed operation, should be formed of a single crystalline silicon thin film which can provide a mobility of 400 $cm^2/Vs$ or higher. However, it is difficult to form a single crystalline silicon layer on glass, there is a limitation to the size, and the manufacturing costs are too high, so that devices can be manufactured on mass scale using the single crystalline silicon.

SUMMARY OF THE DISCLOSURE

The present invention may provide a substrate with a locally integrated single crystalline silicon layer and a method of fabricating the substrate.

The present invention also may provide a substrate with an integrated hetero-crystalline silicon layer including a single crystalline silicon layer and a method of fabricating the substrate.

According to an aspect of the present invention, there may be provided a substrate with a locally integrated single crystalline silicon layer, the substrate including: a support plate; a buffer layer formed on the support plate; a single crystalline silicon layer located in a first region defined on the support plate, the single crystalline silicon layer being attached to the buffer layer by bonding after being separately manufactured; and a non-single crystalline silicon layer located in a second region on the support plate, the non-single crystalline silicon layer being formed on the buffer layer by deposition.

According to another aspect of the present invention, there may be provided a method of fabricating a substrate with a locally integrated single crystalline silicon layer, the method including: forming a buffer layer on a support plate; separately fabricating a single crystalline silicon layer; attaching the single crystalline silicon layer having a predetermined thickness, which is separately fabricated, to a predetermined portion in the support plate; forming a non-single crystalline silicon layer having a predetermined thickness to cover the single crystalline silicon layer and the buffer layer; and processing the non-single crystalline silicon layer to expose a surface of the non-single crystalline silicon layer and to level the surface of the non-single crystalline silicon layer with a surface of the amorphous silicon layer.

BRIEF DESCRIPTION OF THE DRAWINGS

The above and other features and advantages of the present invention are described in detailed exemplary embodiments thereof with reference to the attached drawings in which.

DETAILED DESCRIPTION OF EXEMPLARY EMBODIMENTS

Hereinafter, a substrate and an exemplary method of fabricating the substrate according to the present invention will be described in detail with reference to the appended drawings.

Figure 1:
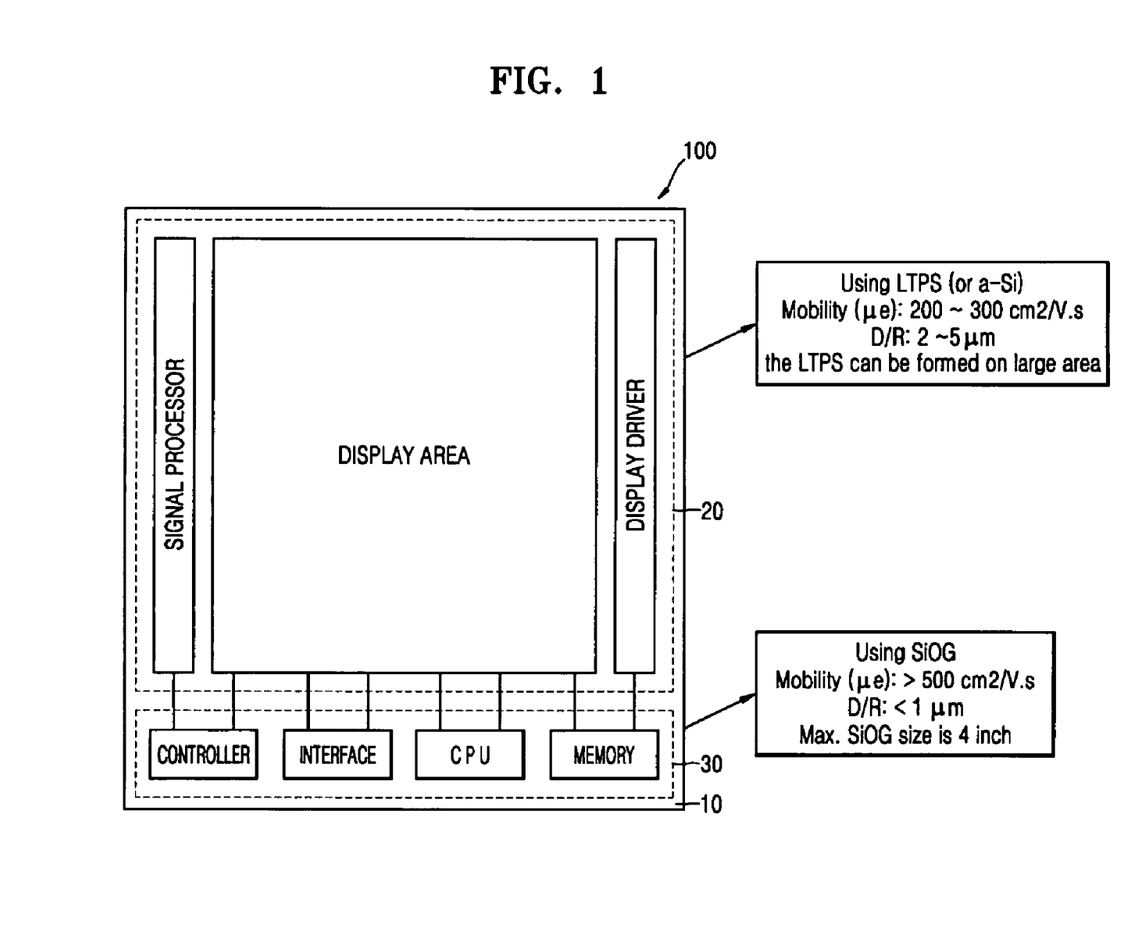
FIG. 1 illustrates the layout of a support plate in a single crystalline silicon on glass (SiOG) display fabricated according to the present invention.

FIG. 1 shows a layout of a substrate for a display device according to an embodiment of the present invention.

Referring to FIG. 1, constituent elements of a display device 100 are arranged on a support plate formed of glass or plastic.

In the support plate 10, a first region 20 utilizing crystalline or amorphous silicon occupies a large portion of the support plate 10, and a second region 30 utilizing single crystalline silicon occupies the remaining portion.

The first region 20 includes a display area having pixels including switching devices such as thin film transistors (TFT), a signal processor connected to the display area, and a display driver. The elements of the first region 20 use low temperature poly silicon (LTPS) or amorphous silicon having a mobility of about 200-300 $cm^2/Vs$ as a semiconductor material. LTPS or amorphous silicon can be formed over a very large area, and thus can be directly formed on the support plate 10. Polycrystalline silicon is obtained by crystallizing the amorphous silicon.

In addition, the second region 30 includes a plurality of elements using single crystalline silicon having as high electron mobility as semiconductor materials. The second region 30 includes, for example, a central processor unit (CPU), a memory, a controller, and an interface, which are not included in the first region 20 of the display device. These elements use single crystalline silicon having a high mobility of 400 cm$^2$/Vs or greater for high-speed image processing.

The present invention provides a structural base in which single crystalline silicon (layer or film) is arranged on the support plate 10 by being attached thereto, thereby enabling single crystalline silicon semiconductor devices to be integrated in a large-sized electronic device, such as a display device described above, and in particular, in the support plate in which a display area of the display device is formed. According to a feature of the present invention, a single crystalline silicon semiconductor device can be integrated in a very large sized support plate without limitation to the size of the support plate.

Hereinafter, embodiments of a method of fabricating the substrate described above will be described.

Figure 2A:
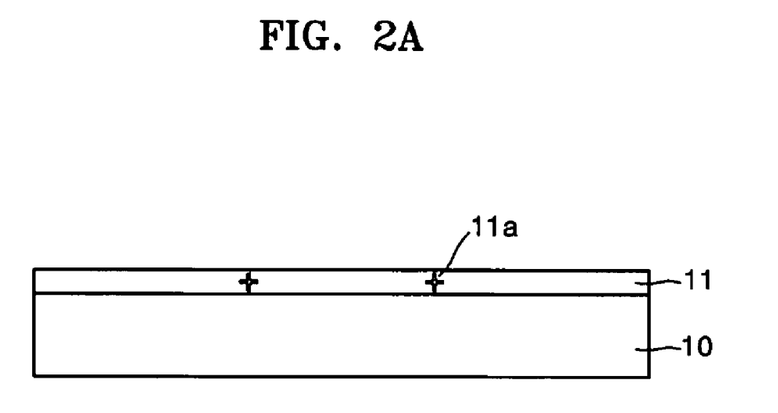
FIGS. 2A through 2G are sectional views for illustrating the concept of a representative method of fabricating a silicon substrate according to the present invention.

Referring to FIG. 2A, a buffer layer 11 is formed on the support plate 10, which is formed of glass or plastic. The buffer layer 11 can be formed as a single layer using polycrystalline silicon (p-Si) or SiO$_2$. Alignment marks 11a, which are commonly used, are arranged at predetermined positions on the support plate 10 in order to align a single crystalline silicon substrate 40.

Figure 2B:
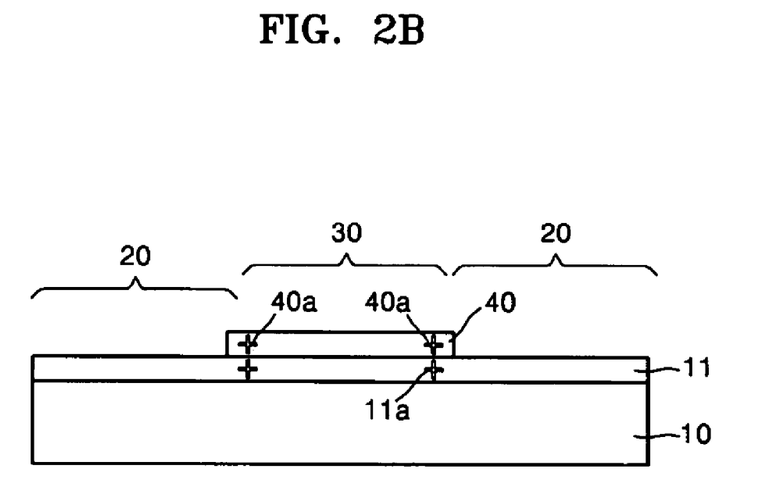

Referring to FIG. 2B, the single crystalline silicon substrate 40, which is previously fabricated, is attached to a predetermined region in the buffer layer 11. Here, the region to which the single crystalline silicon substrate 40 is attached corresponds to the second region 30 described above, and the remaining region of the buffer layer 11 corresponds to the first region 20.

The single crystalline silicon substrate 40 is attached to the buffer layer 11 using a general silicon wafer bonding technique involving activating a surface of the single crystalline silicon substrate 40 using oxygen plasma, etc. and thermal-pressing, etc. Alignment marks 40a corresponding to the alignment marks 10a on the support plate 10 are arranged in the single crystalline silicon substrate 40 in order to align the single crystalline silicon substrate 40 with respect to the second region 30.

A process of fabricating the single crystalline silicon substrate 40 will be described later with reference to two embodiments. The single crystalline silicon substrate 40 may further include another layer, for example, a silicon oxide layer in addition to the single crystalline silicon layer.

Figure 2C:
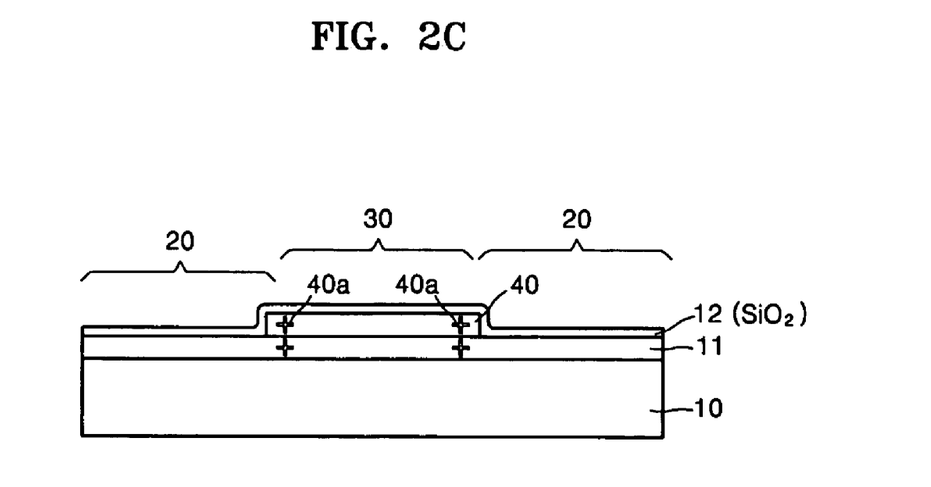

Referring to FIG. 2C, an insulating layer, for example, a silicon oxide layer 12, is formed on the stacked structure on the support plate 10. Here, the thickness of the silicon oxide layer 12 has to be smaller than the thickness of the single crystalline silicon substrate 40.

Figure 2D:
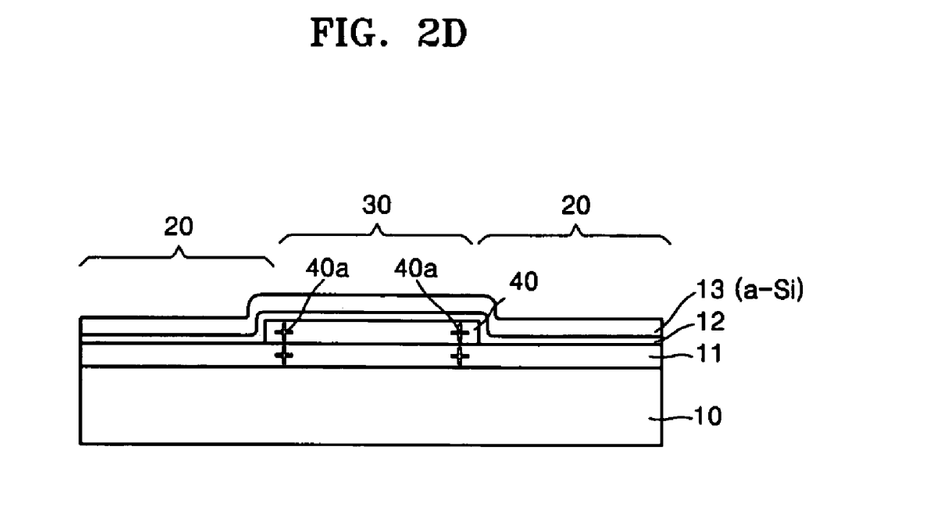

Referring to FIG. 2D, an amorphous silicon (a-Si) layer 13 is deposited on the silicon oxide layer 12 to a sufficient thickness, for example, at least to a thickness that is the same or slightly larger than the thickness of the single crystalline silicon substrate 40. The a-Si layer 13 is poly-crystallized through a subsequent process and can be used as a material for semiconductor devices, such as LTPS-TFT, etc. A substrate including the single crystalline silicon substrate 40 and the a-Si layer 13 which have the same height is obtained through a subsequent chemical or a chemical-mechanical processing method using etching, polishing, etc., as shown in FIG. 2F.

In the case of using polishing, the a-Si layer 13 is polished using a general chemical mechanical polishing (CMP) method to planarize the surface of the a-Si layer 13 to the same height as the single crystalline silicon substrate 40.

Figure 2E:
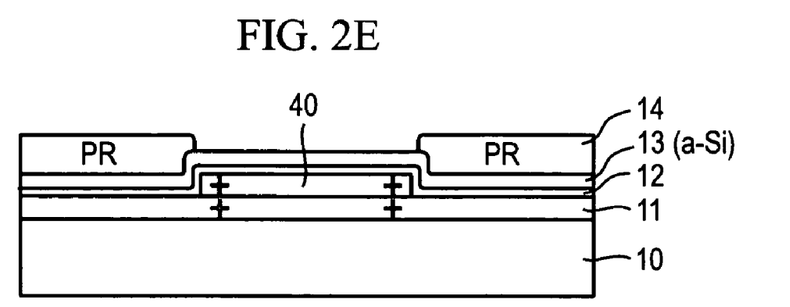
Figure 2F:
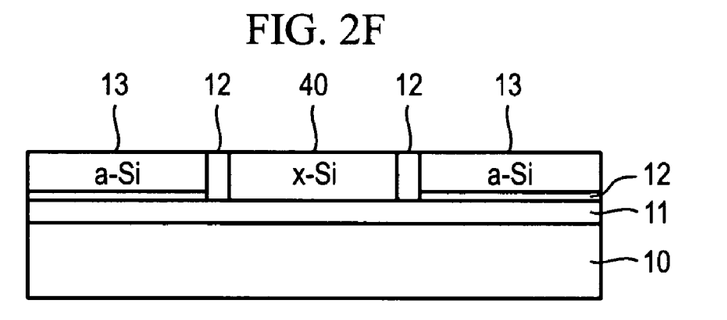

In the case of using etching, not polishing, after forming a photoresist (PR) mask 14 exposing a top portion of the single crystalline silicon substrate 40, as shown in FIG. 2E, the a-Si layer 13 and the silicon oxide layer 12 covering the top portion of the single crystalline silicon substrate 40 are dry etched to expose the surface of the single crystalline silicon substrate 40. After the etching process is completed, the PR mask 14 is removed to obtain a desired substrate as shown in FIG. 2F.

In the case where the a-Si layer 13 is polished by etching, to obtain the single crystalline silicon substrate 40 and the a-Si layer 13 that have the same height, the a-Si layer 13 has to be formed to an appropriate thickness.

The exposed single crystalline silicon substrate 40 is used as an active layer for a semiconductor device using single crystalline silicon, such as the CPU, memory, interface, controller, etc., in particular, for a SiOG-TFT of a semiconductor device.

Figure 2G:
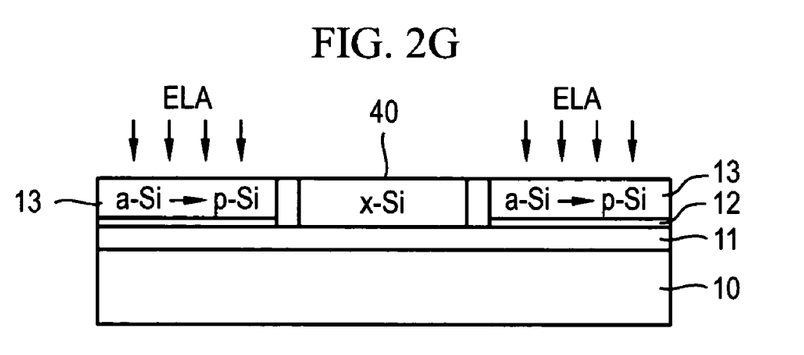

Referring to FIG. 2G, the a-Si layer 13 is crystallized into polycrystalline silicon (p-Si) through thermal processing, such as excimer laser annealing (ELA).

The support plate obtained through the process illustrated in FIG. 2G and the silicon material layers thereon can be used to manufacture a semiconductor device.

Figure 3:
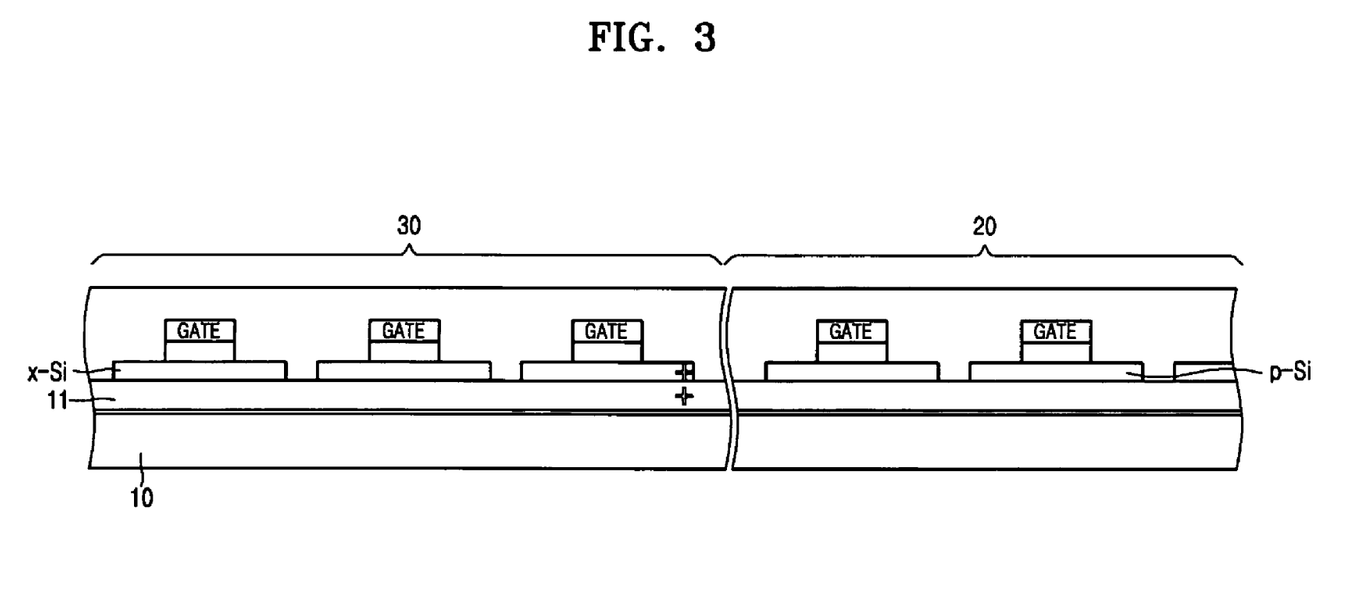
FIG. 3 is a sectional view for illustrating the concept of a representative method of fabricating an applied device including a 3-dimensional LSI using a silicon substrate according to the present invention.

FIG. 3 illustrates an example of manufacturing a TFT, which is a representative semiconductor device, using the substrate fabricated by the above-described method according to the present invention.

Referring to FIG. 3, an a-Si or p-Si TFT and an x-Si TFT are formed in the first region 20, in which the amorphous or polycrystalline silicon layer is formed, and the second region 30, in which the single crystalline silicon layer is formed.

A single crystalline silicon substrate 41, which is separately manufactured, is bound to the second region 30 and is processed to form a 3-dimensional LSI having a multi-layered TFT.

Figure 4A:
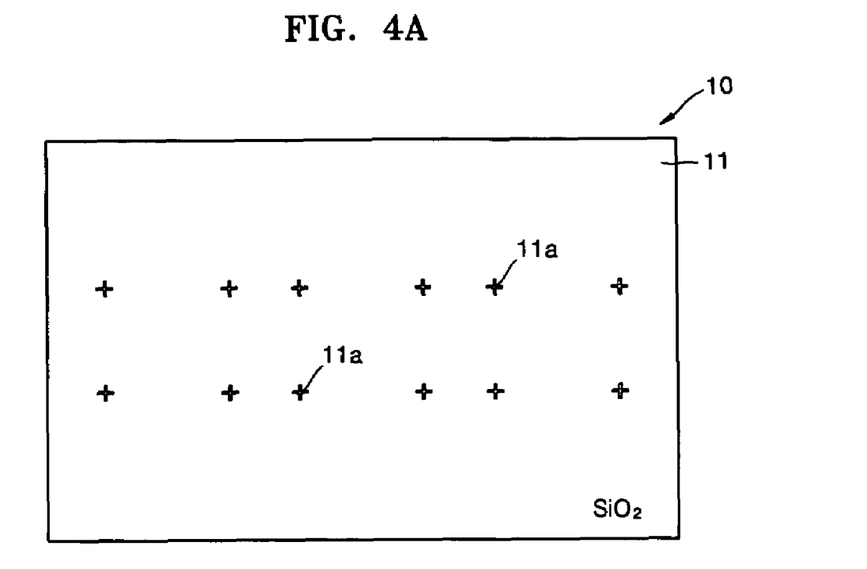
FIGS. 4A and 4B illustrate representative layouts of the support plate before and after a single crystalline silicon layer is bound.
Figure 4B:
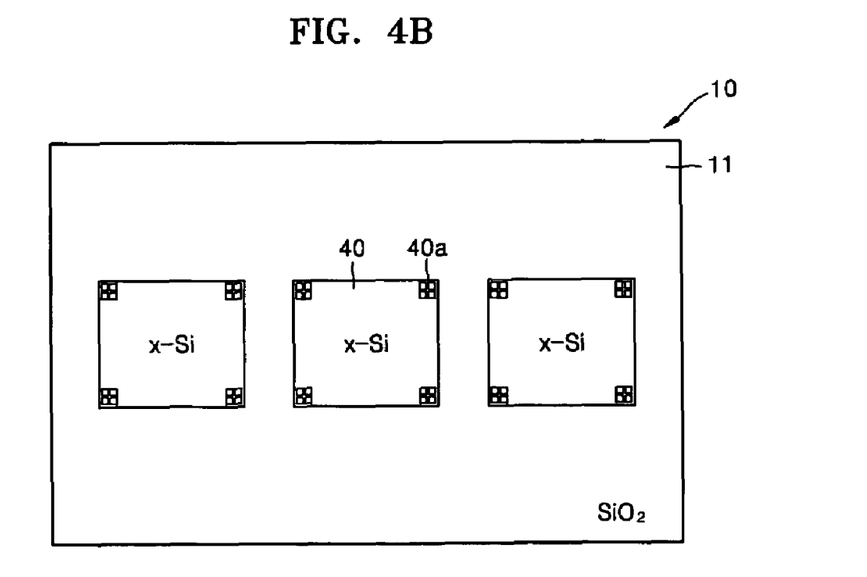

FIGS. 4A and 4B illustrate an example in which three single crystalline silicon substrates are formed on one support plate. In particular, FIG. 4A illustrates a state where the buffer layer 11 with alignment marks 11a is formed on the support plate 10, and FIG. 4B illustrates a state where three single crystalline silicon layers 40 with alignment marks 40a are locally formed in three regions of the buffer layer 11.

Figure 5:
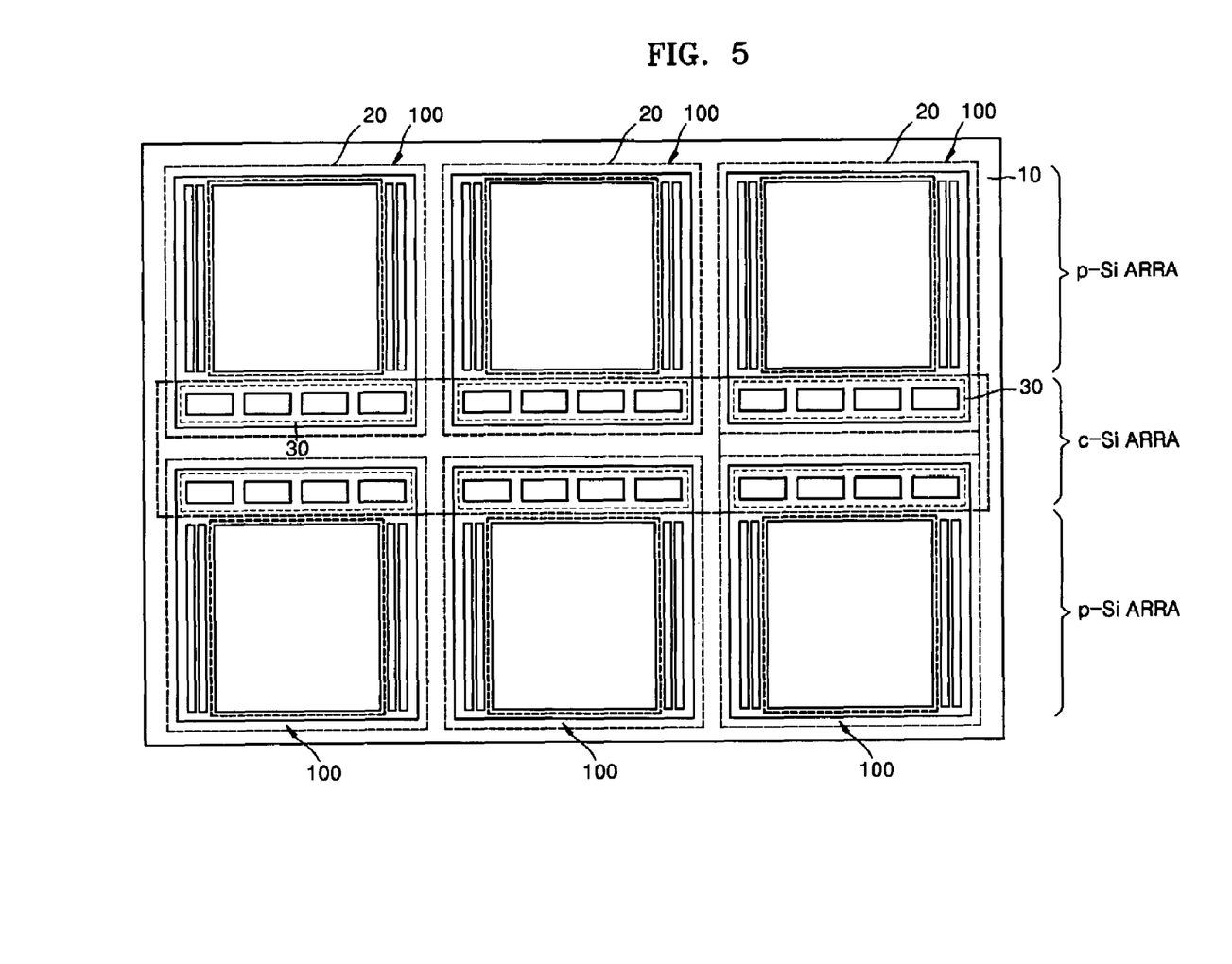
FIG. 5 illustrates a representative layout of a large support plate for fabricating a plurality of display devices according to the present invention.

FIG. 5 is a planar layout of the support plate 10 which is large enough to fabricate a plurality of display devices at the same time.

Referring to FIG. 5, one support plate 10 is divided such that six display devices 100 can be formed therein. Each of the display devices 100 has the structure shown in FIG. 1. In each of the display devices 100, the second region 30, in which a high mobility single crystalline silicon layer is formed, is located in a center region of the support plate 10, and the first region 20 is located on an outer side of the second region 30. According to the present invention, a plurality of display devices 100, each having a single crystal semiconductor device and a polycrystalline semiconductor device, can be formed on one support plate 10 by integrating single crystalline silicon layers into the support plate 10.

Hereinafter, methods of fabricating a single crystalline silicon substrate according to the present invention will be described.

<Method of Fabricating a Substrate Using a Crystal Growth Plate>

Figure 6A:
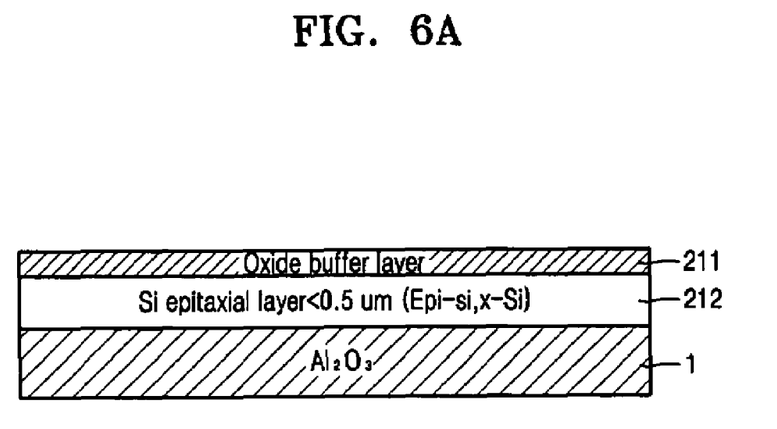
FIGS. 6A through 6F are sectional views for illustrating a method of fabricating a single crystalline silicon layer according to an embodiment of the present invention.

Referring to FIG. 6A, an Si epitaxial layer, i.e., a single crystalline silicon film 212, and an oxide layer, for example, a buffer layer 211, are sequentially formed on a sapphire (Al$_2$O$_3$) substrate 1, which is a crystal growth plate. It is preferable that the thickness of the single crystalline silicon film 212 is controlled to be 0.5 μm or less.

Figure 6B:
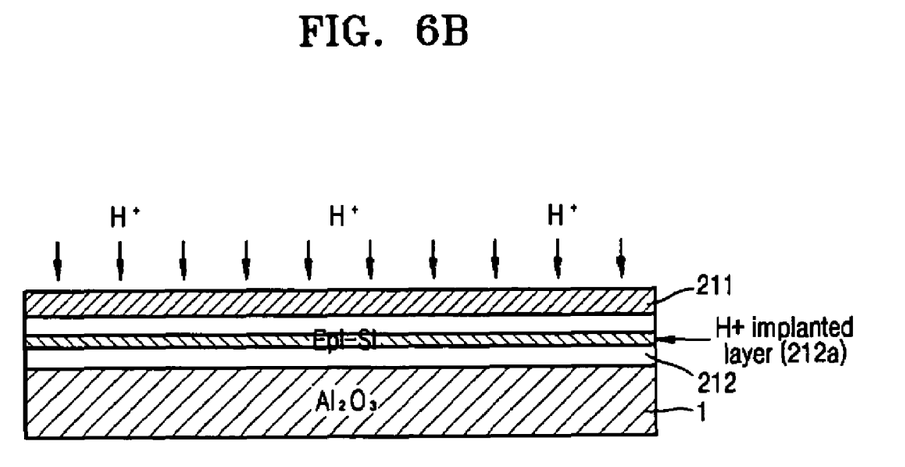

Referring to FIG. 6B, an implanted layer is formed as a separation layer 212a in the middle of the single crystalline silicon film 212 by implanting hydrogen ions (H$^+$).

Figure 6C:
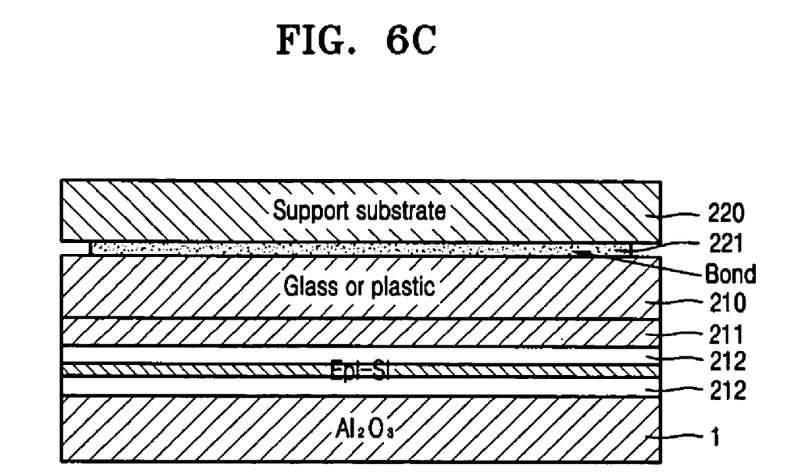

Referring to FIG. 6C, a glass or plastic substrate 210 attached to a supporter 220 by a bond layer 221 is bound to the silicon film 212. To this end, the buffer layer 211 and the underlying silicon film 212 are activated using oxygen plasma and then bound to the substrate 210 at room temperature in an air atmosphere.

Figure 6D:
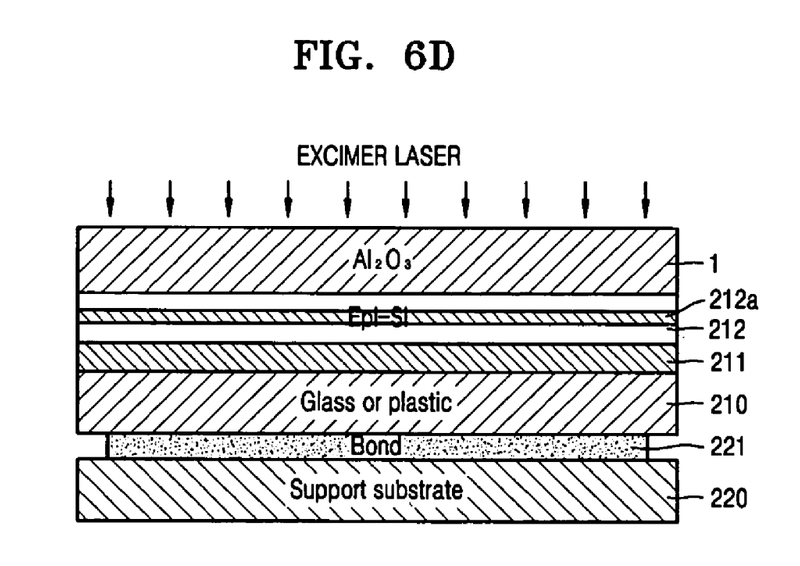
Figure 6E:
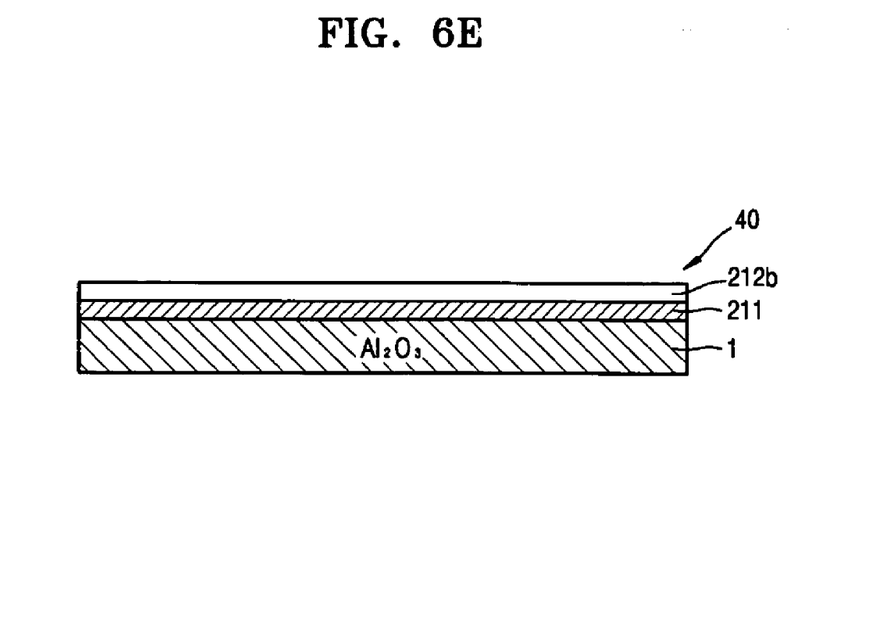
Figure 6F:
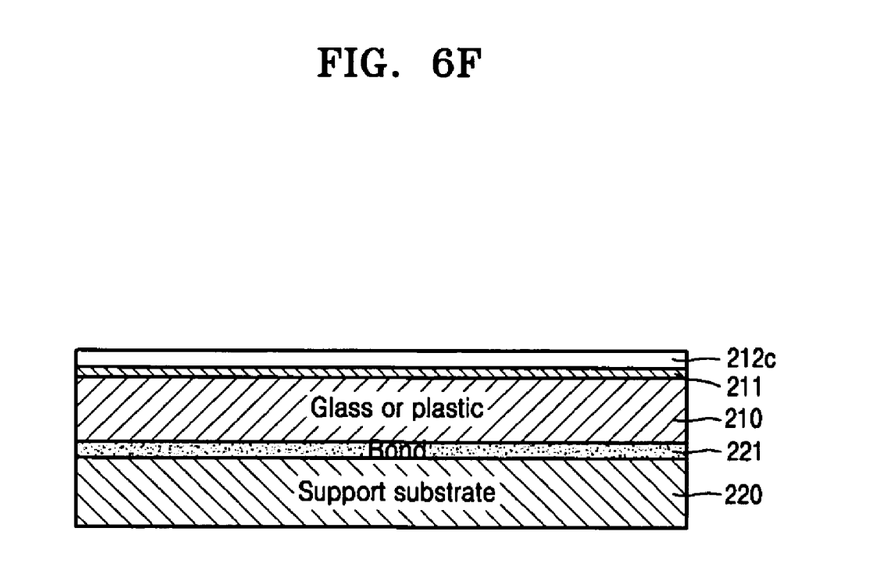

Referring to FIG. 6D, the thermal energy, for example, an excimer laser of 308 nm, is uniformly applied to the entire surface of the crystal growth plate 1. The implanted layer, that is, the separation layer 212a, where strain stress is concentrated due to the impurities, is separated by the thermal energy, so that the silicon film 212 is divided into a silicon film 212b on the side of the sapphire substrate 1 and a silicon film 212c on the side of the glass or plastic substrate 210 as shown in FIGS. 6E and 6F. Alternatively, the separation layer 212a may be separated by heating to approximately 500° C.

Referring to FIG. 6F, the supporter 220 is separated from the bottom surface of the substrate 210 to obtain a single crystalline silicon substrate 40 used in the present invention. Finally, the substrate 210 is removed from the silicon film 212c, and the remaining buffer layer 211 can be removed in an additional polishing process.

<Method of Fabricating a Single Crystalline Substrate Using a Porous Material>

Figure 7A:
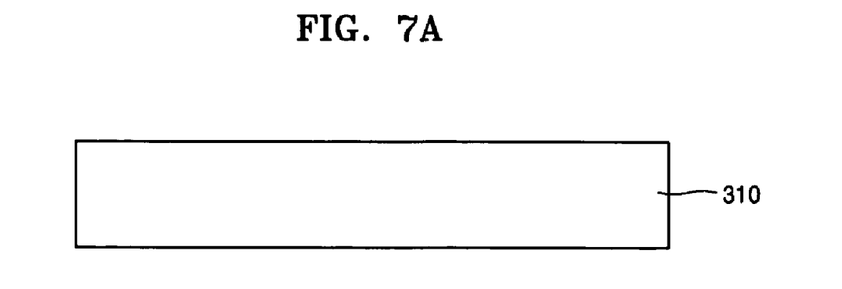
FIGS. 7A through 7L are sectional views for illustrating a method of fabricating a single silicon layer according to another embodiment of the present invention.
Figure 7B:
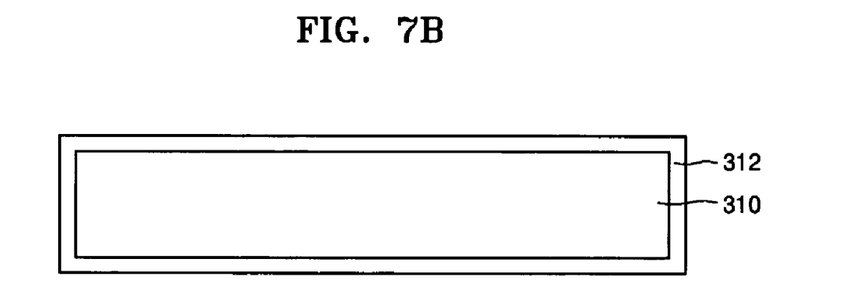
Figure 7C:
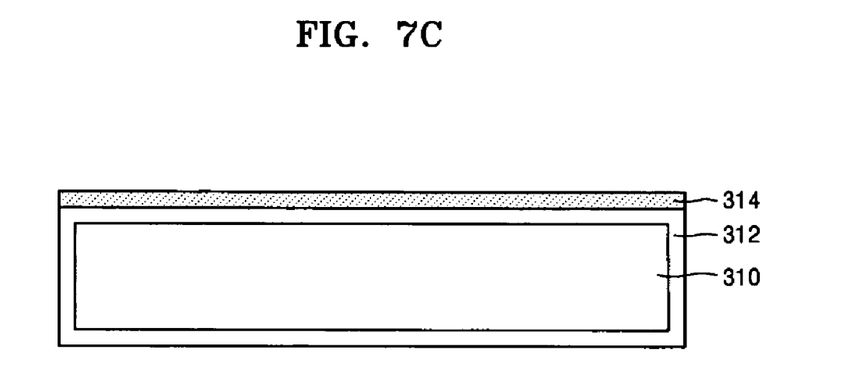
Figure 7D:
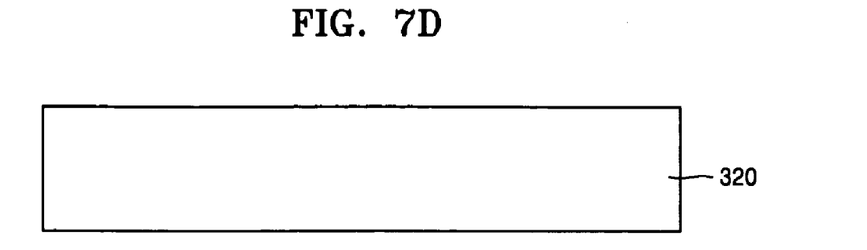
Figure 7E:
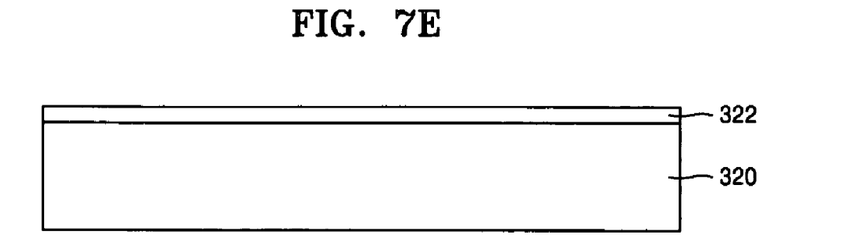
Figure 7F:
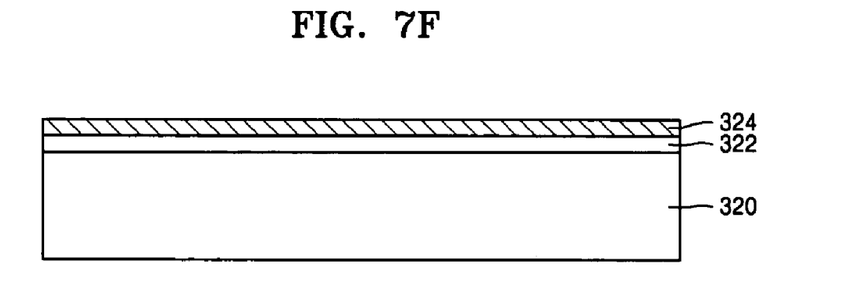
Figure 7G:
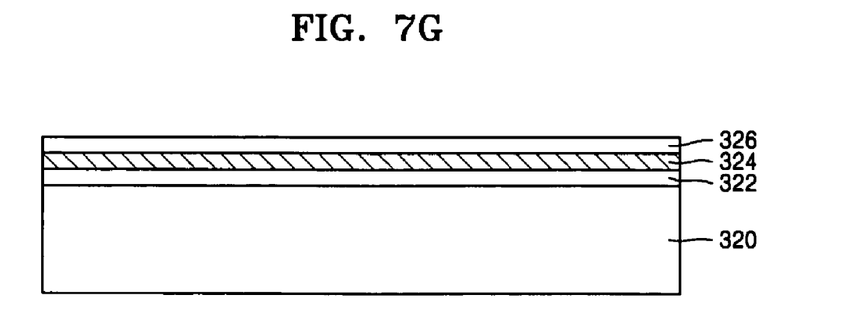
Figure 7H:
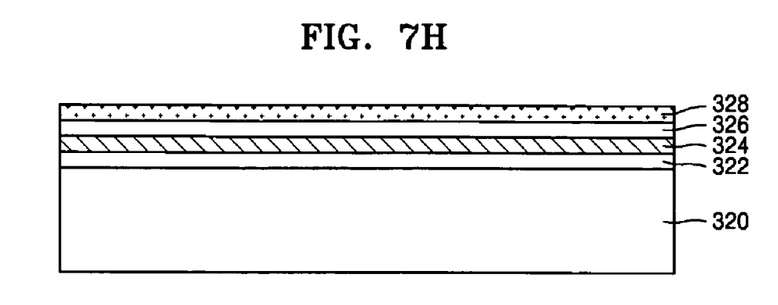
Figure 7I:
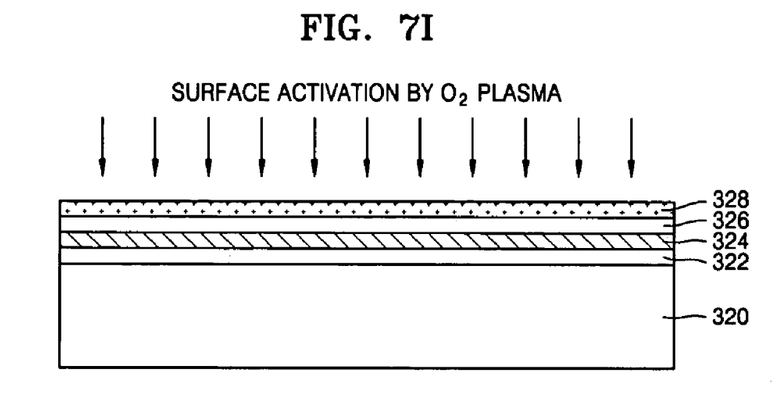
Figure 7J:
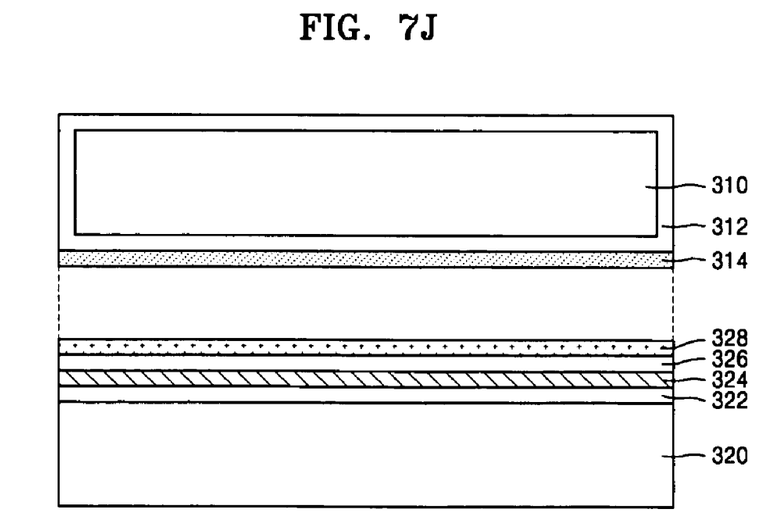
Figure 7K:
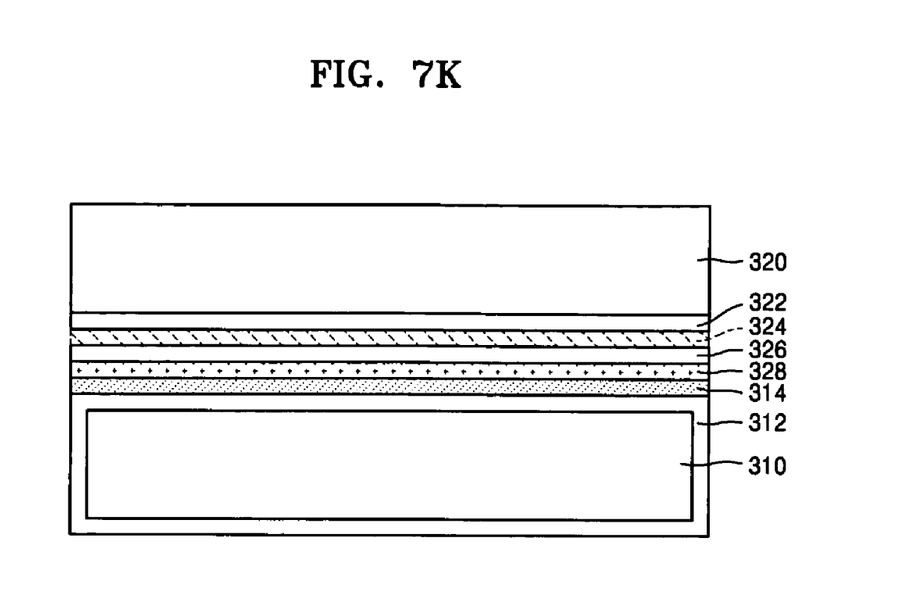

Referring to FIGS. 7A through 7C, an insulating substrate 310 is prepared, and a protective layer 312 is formed on a surface of the substrate 310. The protective layer 312 is formed of a transparent insulating material which is resistant against etchant. An example of such material includes AlN, etc. Next, a bonding layer 314 is formed on the protective layer 312 using a material such as SiO$_2$ or polycrystalline silicon. The protective layer 312 and the bonding layer 314 are not essential and can be omitted.

Referring to FIGS. 7D through 7H, a Si substrate 320 is prepared, and a predetermined thickness of the Si substrate 320 is anodized to form a porous silicon layer 322. For example, to form the porous silicon layer 322, a predetermined thickness of the Si substrate 320 can be electromechanically anodized in a mixed solution of HF and ethanol.

In addition, a SiGe layer 324, a single crystalline silicon layer 326, and a SiO$_2$ layer 328 are sequentially formed on the porous silicon layer 322. Here, the SiGe layer 324 has a relaxed structure, and thus, a strain single crystalline silicon layer 326 can be formed on the SiGe layer 324. The single crystalline silicon layer 326 is a material layer to be integrated into the support plate 10 in the present invention.

Referring to FIGS. 7I through 7L, the surface of the SiO$_2$ layer 328 is activated by treatment using oxygen (O$_2$) plasma. In addition, the insulating substrate 310 prepared above is bound to the activated SiO$_2$ layer 328. Here, the insulating substrate 310 is bound, a surface of the bond layer 314 formed on the insulating layer 310 may be activated by treatment using oxygen (O$_2$) plasma.

Next, the stacked structure is turned upside down such that the insulating substrate 310 is at the bottom. Next, the SiGe layer 324 is removed by selective etching. As an etchant for the selective etching of the SiGe layer 324, a solution mixture of 50% HF, 60% HNO$_3$, and H$_2$O in a ratio of 1:90-129:60 is used. Other etchants can be used to selectively etch the SiGe layer 24.

Figure 7L:
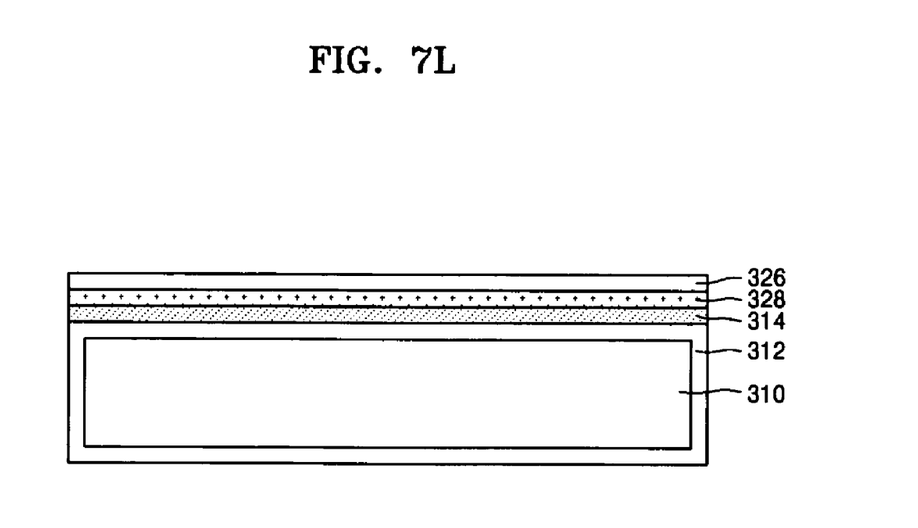

As a result of the selective removal of the SiGe layer 324, the porous silicon layer 322 and the Si substrate 320 on the SiGe layer 324 are separated from the stacked structure. As a result, as shown in FIG. 7L, the single crystalline silicon layer 326 on the insulating substrate 310 is obtained. The insulating substrate 310 is removed from the stacked structure, and the resulting structure is integrated into the support plate 10 described above according to the present invention.

The above-described methods of fabricating a single crystalline silicon substrate are illustrative and do not limit the scope of the present invention.

As described above, according to the present invention, single crystalline silicon semiconductor devices can be integrated into a large substrate. In the present invention, since SiOG TFTs and LTPS TFTs can be integrated into one support plate or substrate, a system on glass can be realized on the substrate.

According to the present invention, a large screen display can be implemented regardless of the limited size of single crystalline silicon substrates. A method of fabricating a substrate with a single crystalline silicon layer according to the present invention can be used in any field requiring a large substrate or localized single crystalline silicon.

According to the present invention, silicon layers are formed on a plastic or glass substrate, a system on glass (SOG) or a system on plastic (SOP) using single crystalline silicon can be realized. Therefore, according to the present invention, highly reliable, high-performance TFTs with a small difference in performance between devices can be fabricated using single crystalline silicon. Furthermore, a three-dimensional LSI can be built on a large substrate using the technology of binding separate single crystalline silicon substrates, thereby enabling high-performance apparatuses to be developed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A substrate with a locally integrated single crystalline silicon layer, the substrate comprising:
   a support plate having a first region and a second region;
   a buffer layer comprising a polycrystalline silicon layer formed on the support plate;
   a single crystalline silicon layer located in the first region defined on the support plate while in direct contact with said polycrystalline silicon layer of said buffer layer, the single crystalline silicon layer being attached to the buffer layer by bonding after being separately manufactured; and
   a non-single crystalline silicon layer located in the second region on the support plate, the non-single crystalline silicon layer being formed on the buffer layer by deposition.

2. The substrate of claim 1, wherein the non-single crystalline silicon layer is formed of one of amorphous silicon, polycrystalline silicon, and a mixture of amorphous silicon and polycrystalline silicon.

3. The substrate of claim 1, further comprising an insulating layer between the buffer layer and the non-single crystalline silicon layer.

4. The substrate of claim 3, wherein the insulating layer comprises a silicon oxide layer.

5. The substrate of claim 1, further comprising an insulating layer between the single crystalline silicon layer and the non-single crystalline silicon layer.

6. The substrate of claim 5, wherein the insulating layer comprises a silicon oxide layer.

* * * * *